(12) United States Patent
Wong et al.

(10) Patent No.: US 6,466,476 B1
(45) Date of Patent: Oct. 15, 2002

(54) DATA CODING FOR MULTI-BIT-PER-CELL MEMORIES HAVING VARIABLE NUMBERS OF BITS PER MEMORY CELL

(75) Inventors: Sau Ching Wong, Hillsborough, CA (US); Kimberley Johnsen, Seattle, WA (US)

(73) Assignee: Multi Level Memory Technology, San Jose, CA (US)

(*) Notice: Subject to any disclaimer, the term of this patent is extended or adjusted under 35 U.S.C. 154(b) by 24 days.

(21) Appl. No.: 09/766,272

(22) Filed: Jan. 18, 2001

(51) Int. Cl.$^7$ ................................................ G11C 7/00
(52) U.S. Cl. ........................... 365/185.03; 365/189.01; 365/189.05; 365/189.12
(58) Field of Search ................ 365/230.01, 189.01, 365/189.05, 189.12, 185.03

(56) References Cited

U.S. PATENT DOCUMENTS

| | | |
|---|---|---|
| 4,964,079 A | 10/1990 | Devin |
| 5,043,940 A | 8/1991 | Harari |
| 5,095,344 A | 3/1992 | Harari |
| 5,172,338 A | 12/1992 | Mehrotra et al. |
| 5,218,569 A | 6/1993 | Banks |
| 5,262,684 A | 11/1993 | Noguchi et al. |
| 5,293,560 A | 3/1994 | Harari |
| 5,399,891 A | 3/1995 | Yiu et al. |
| 5,408,431 A | 4/1995 | Challa |
| 5,450,363 A | 9/1995 | Christopherson et al. |
| 5,504,760 A | 4/1996 | Harari et al. |
| 5,515,317 A | 5/1996 | Wells et al. |
| 5,521,865 A | 5/1996 | Ohuchi et al. |
| 5,526,307 A | 6/1996 | Yiu et al. |
| 5,541,886 A | 7/1996 | Hasbun |
| 5,638,320 A | 6/1997 | Wong et al. |
| 5,642,312 A | 6/1997 | Harari |
| 5,680,341 A | 10/1997 | Wong et al. |
| 5,682,349 A | 10/1997 | Campardo et al. |
| 5,687,115 A | 11/1997 | Wong et al. |
| 5,691,938 A | 11/1997 | Yiu et al. |
| 5,694,356 A | 12/1997 | Wong et al. |
| 5,694,357 A | 12/1997 | Mori |
| 5,717,632 A | 2/1998 | Richart et al. |
| 5,745,409 A | 4/1998 | Wong et al. |
| 5,751,634 A | 5/1998 | Itoh |
| 5,761,222 A | 6/1998 | Baldi |
| 5,768,192 A | 6/1998 | Eitan |
| 5,790,453 A | 8/1998 | Chevallier |
| 5,790,456 A | 8/1998 | Haddad |
| 5,801,994 A | 9/1998 | Chang et al. |
| 5,802,553 A | 9/1998 | Robinson et al. |
| 5,822,781 A | 10/1998 | Wells et al. |
| 5,859,795 A | 1/1999 | Rolandi |
| 5,859,858 A | 1/1999 | Leeman |

(List continued on next page.)

*Primary Examiner*—Viet Q. Nguyen
(74) *Attorney, Agent, or Firm*—David T. Millers

(57) ABSTRACT

A multi-bit-per-cell non-volatile memory stores different portions of a data stream using different numbers of bits per cell. In particular, data that requires a high degree of data integrity (e.g., the header of a data frame) is stored using a relatively small number of bits per memory cell. Data that is more error-tolerant (e.g., the main data representing music, images, or video) is stored using a relatively large number of bits per memory cell. Write circuitry decodes an input data stream and determines the number of bits to be written in each memory cell. Read circuitry decodes an output data stream and determines a number of bits read from each memory cell to generate the data stream. One such memory includes a decoder in the write circuitry and a decoder in the read circuitry, and another embodiment includes a single decoder that the write and read circuits share. The decoder can include programmable logic array that a user can program according to a protocol used in the data stream to be recorded in and played back from the memory.

40 Claims, 5 Drawing Sheets

U.S. PATENT DOCUMENTS

| | | | |
|---|---|---|---|
| 5,862,080 A | 1/1999 | Harari et al. | |
| 5,870,326 A | 2/1999 | Schuelein | |
| 5,880,993 A | 3/1999 | Kramer et al. | |
| 5,880,996 A | 3/1999 | Roohparvar | |
| 5,896,340 A | 4/1999 | Wong et al. | |
| 5,909,390 A | 6/1999 | Harari | |
| 5,909,449 A | 6/1999 | So et al. | |
| 5,936,887 A | 8/1999 | Choi et al. | |
| 5,943,693 A | 8/1999 | Barth | |
| 5,956,268 A | 9/1999 | Lee | |
| 5,970,012 A | 10/1999 | Takeshima | |
| 5,982,663 A | 11/1999 | Park | |
| 5,999,445 A | 12/1999 | Rolandi et al. | |
| 6,002,614 A | 12/1999 | Banks | |
| 6,011,725 A | 1/2000 | Eitan | |
| 6,026,015 A | 2/2000 | Hirakawa | |
| 6,038,166 A | 3/2000 | Wong | |
| 6,055,181 A | 4/2000 | Tanaka et al. | |
| 6,058,060 A | 5/2000 | Wong | |
| 6,067,248 A | 5/2000 | Yoo | |
| 6,075,722 A | 6/2000 | Hibino | |
| 6,078,526 A | 6/2000 | Mitani | |
| 6,081,448 A | 6/2000 | Pasotti et al. | |
| 6,094,368 A | 7/2000 | Ching | |
| 6,097,637 A | 8/2000 | Bauer et al. | |
| 6,122,193 A | 9/2000 | Shibata et al. | |
| 6,124,157 A | 9/2000 | Rahim | |
| 6,130,452 A | 10/2000 | Lu et al. | |
| 6,133,098 A | 10/2000 | Ogura et al. | |
| 6,134,141 A | 10/2000 | Wong | |
| 6,134,143 A | 10/2000 | Norman | |
| 6,134,145 A | 10/2000 | Wong | |
| 6,137,719 A | 10/2000 | Tsuruda et al. | |
| 6,149,316 A | 11/2000 | Harari et al. | |
| 6,154,391 A | 11/2000 | Takeuchi et al. | |
| 6,160,587 A * | 12/2000 | Walker et al. | 348/478 |
| 6,166,407 A | 12/2000 | Ohta | |
| 6,166,959 A | 12/2000 | Gupta et al. | |
| 6,172,912 B1 | 1/2001 | Hirano et al. | |
| 6,181,597 B1 | 1/2001 | Nachumovsky | |
| 6,195,287 B1 | 2/2001 | Hirano | |
| 6,208,542 B1 | 3/2001 | Wang | |
| 6,212,121 B1 | 4/2001 | Ryu et al. | |
| 6,219,276 B1 | 4/2001 | Parker | |
| 6,219,282 B1 | 4/2001 | Tanaka | |
| 6,233,176 B1 | 5/2001 | Masuoka | |
| 6,233,717 B1 | 5/2001 | Choi | |
| 6,236,081 B1 | 5/2001 | Fukumoto | |
| 6,240,014 B1 | 5/2001 | Yoo | |
| 6,248,633 B1 | 6/2001 | Ogura et al. | |
| 6,256,231 B1 | 7/2001 | Lavi et al. | |
| 6,259,627 B1 | 7/2001 | Wong | |
| 6,278,633 B1 | 8/2001 | Wong et al. | |
| 6,285,574 B1 | 9/2001 | Eitan | |
| 6,295,595 B1 | 9/2001 | Wildenberg et al. | |
| 6,301,154 B1 | 10/2001 | Sumitani | |
| 6,307,776 B1 | 10/2001 | So et al. | |
| 6,314,025 B1 | 11/2001 | Wong | |
| 6,317,363 B1 | 11/2001 | Guterman et al. | |
| 6,330,185 B1 | 12/2001 | Wong et al. | |
| 6,343,138 B1 * | 1/2002 | Rhoads | 382/100 |

* cited by examiner

DATA CODING FOR MULTI-BIT-PER-CELL MEMORIES HAVING VARIABLE NUMBERS OF BITS PER MEMORY CELL

BACKGROUND

1. Field of the Invention

This invention relates to multi-bit-per-cell memory, digital recording of music and other information, and methods for using multi-bit-per-cell memory to provide the maximum data density that is consistent with data integrity requirements.

2. Description of Related Art

Multi-bit-per-cell memories can increase the density of data storage in an integrated circuit device by storing multiple bits of information in a memory cell that would store only a single bit in a conventional binary memory. One type of non-volatile multi-bit-per-cell memory contains an array of floating gate transistors, which act as memory cells. Each floating gate transistor has a threshold voltage that represents a data value stored in a memory cell. In particular, the useable range for the threshold voltage of a memory cell is divided into windows with each window being associated with a different value. A write operation sets the threshold voltage of a memory cell to a level in the window corresponding to the value being written. A read operation identifies which window contains the current threshold voltage of a memory cell and generates a signal representing the value associated with the identified window.

A conventional binary memory divides the threshold voltage range into two windows, a high threshold voltage window representing one binary value 1 or 0 and a low threshold voltage window representing the other binary value 0 or 1. A memory storing two bits per cell uses four threshold voltage windows corresponding to four values that two bits can represent. More generally, a memory storing N bits per cell uses $2^N$ windows corresponding to all possible N-bit values. Accordingly, the number ($2^N$) of windows increases exponentially as the number (N) of bits per cell increases, and the windows similarly decrease in width as greater numbers of windows are fit within the same available threshold voltage range.

Narrower threshold voltage windows make precise writing and reading of data more difficult. Additionally, charge leakage and other effects that change threshold voltages make preserving threshold voltages in narrow windows (i.e., preserving stored data) difficult. When the number of bits per cell becomes too large, a memory may be unable read, write, or preserve data values with the accuracy that data integrity requirements mandate. Accordingly, when data integrity requirements are high, a memory cannot store as many bits per cell and cannot achieve the storage density permitted for data that is more error tolerant.

SUMMARY

In accordance with an aspect of the invention, a memory that is capable of storing different numbers of bits per cell uses fewer bits per cell when storing data having high data integrity requirements and uses more bits per cell when storing error-tolerant data. Accordingly, the memory can achieve both the required data integrity and high storage densities when different types of stored data have different data integrity requirements.

In accordance with one embodiment of the invention, a memory classifies portions of formatted data according to data type, where different data types need different levels of data integrity to achieve desired performance. The formatted data can be, for example, music or image data encoded according to an industry standard. The memory then stores the different types of data using different numbers of bits per cell, where the number of bits per cell for a particular portion of data depends on the data type.

In one specific embodiment of the invention, the memory includes a decoder that receives and decodes a formatted data stream and automatically designates different portions of the data stream for storage at different densities (i.e., different numbers of bits per cell). Each portion of the data structure is then stored with a number of bits per cell that provides the data integrity required for that portion. As a result, storage provides the desired performance and the maximum storage density.

Another embodiment of the invention is a multi-bit-per-cell-memory that includes: an array of non-volatile memory cells; a write circuit coupled to the array; and a decoder coupled to receive a data stream and control the write circuit to write data from the data stream into the array. During a recording operation, the decoder decodes the data stream to identify data types for portions of the data stream, and for each of the portions of the data stream, the decoder selects a number of bits written per memory cell when writing data from that portion. The number of bits per memory cell for any portion of the data stream is selected according to the data type of the portion.

Generally, the memory further includes a read circuit coupled to the array. The decoder that controls the write circuit can control the read circuit, or a second decoder can control the read circuit. During a playback operation, the decoder that controls the read circuit receives a data stream that the read circuit reads from the array. That decoder decodes the data stream to identify data types for portions of the data stream, and for each of the portions of the data stream, the decoder selects a number of bits to read from each memory cell storing that portion. The number of bits read per memory cell for any portion of the data stream is selected according to the data type of the portion.

In accordance with another aspect of the invention, the decoder or decoders in the multi-bit-per-cell memory can include programmable array logic or other similar circuitry that can be programmed or reprogrammed according to the format or protocol expected for the input or output data stream. Accordingly, the memory can adapt on-the-fly to storage of data having different formats.

DETAILED DESCRIPTION

In accordance with an aspect of the invention, a multi-bit-per-cell storage device categorizes different classes of data according to the data integrity required and then stores the data requiring higher data integrity using fewer bits per cell. Data that is more error tolerant is stored at higher density. Accordingly, storage density and the quality of output based on the stored data are optimized. The memory is particularly useful for recording and playing back a data stream formatted according to an industry standard. Examples of current industry standards include MP3 (i.e., MPEG-1 Audio Layer III and MPEG-2 Audio Layer III), MPEG-AAC, and Dolby AC-3 for audio or music and bitmap, JPEG, GIF, and any of the several MPEG standards for still images or video. Such applications often only require random access to the start of a data stream or to a frame in the data stream and do not require random access to particular data elements within a frame.

U.S. Pat. App. Ser. No. 09/505,519, entitled "Multi-Bit-Per-Cell Non-Volatile Memory With Maximized Data Capacity", and U.S. Pat. App. Ser. No. 09/492,949, entitled "Data Management for Multi-Bit-Per-Cell Memories," describe memories capable of storing different numbers of bits per cell and are hereby incorporated by reference in their entirety.

Figure 1:
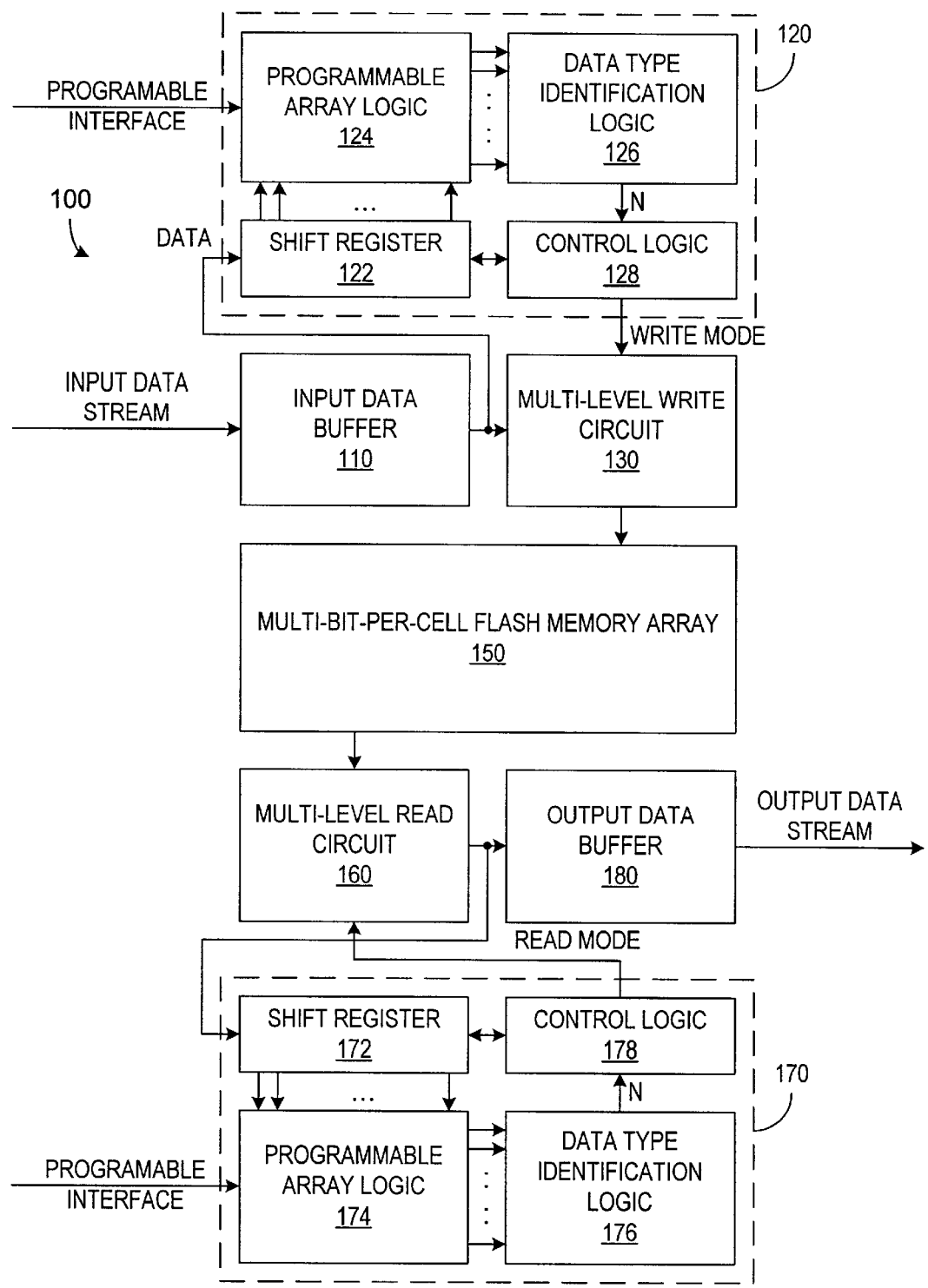
FIG. 1 is a block diagram of a multi-bit-per-cell memory in accordance with an embodiment of the invention.

FIG. 1 is a block diagram of a multi-bit-per-cell memory 100 in accordance with an embodiment of the invention. Memory 100 records or plays back data streams and includes an input data buffer 110, a decoder 120, a multi-level write circuit 130, a multi-bit-per-cell memory array 150, a multi-level read circuit 160, a second decoder 170, and an output data buffer 180. In an exemplary embodiment of the invention, memory array 150 is a multi-bit-per-cell Flash memory array in which each memory cell is a floating gate transistor. Multi-level write circuit 130 and multi-level read circuit 160 can implement read and write methods as described in U.S. pat. App. Ser. No. 09/493,026, entitled "Read And Write Operations Using Constant Row Line Voltage and a Variable Column Line Load" or U.S. Pat. Nos. 5,638,320; 5,680,341; 5,682,352; 5,687,115; 5,694,356; 5,745,409; 5,748,534; 5,748,533; 5,815,425; 5,818,757; 5,969,986; 6,038,166; 6,058,060; and 6,094,368, which are hereby incorporated by reference in there entirety. Alternatively, memory array 150, multi-level write circuit 130, and multi-level read circuit 160 can use any technique for storing, writing, and reading multiple bits of data per memory cell.

In accordance with an aspect of the invention, each of multi-level write circuit 130 and multi-level read circuit 160 operates in several different modes. When writing to a memory cell, a writing mode determines the number N of bits of data that write circuit 130 writes to the memory cell. Similarly, read circuit 160 has different reading modes, where the reading mode for a read operation determines the number N of bits of data that multi-level read circuit 160 extracts from the memory cell.

A record operation in memory 100 writes a sequence of data values from an input data stream to a set of memory cells in memory array 150. A playback operation reconstructs the data stream by reading a set of memory cells. A starting address, which identifies a set of memory cells, can be recorded in a directory or can be fixed according to the architecture of the memory array or the sectors in the memory array. In particular, recording of a data stream can start writing data at the start of a memory block or sector, and playing back the data stream starts at the same address. Addressing and accessing a data stream from its beginning is thus completely conventional even though the use of different storage densities increases the addressing complexity of randomly accessing particular bytes in the data stream. However, for data streams such as data streams representing music, images, or video, full random access is typically not required.

For a recording operation, decoder 120 receives the input data stream via an input data buffer 110. Decoder 120 decodes the data stream to determine how to parse the data stream into data values for writing. The parsing divides the data stream into a sequence of data values. Each data value contains a number N of bits where N for the data value depends on the data integrity required for data of the type the data value represents. The number N can be any integer value in a range between one and a maximum number of bits that can be stored in a single memory cell, or the number N can be restricted to particular values (e.g., 2, 4, or 8) in the range.

Decoder 120 selects writing modes for multi-level write circuit 130 when writing the sequence of data values from input data buffer 110 into Flash memory array 150. The write mode determines the number N of bits that multi-level write circuit 130 writes to a memory cell during a write operation. When a playback operation would be unable to identify the data type before the data is read, for example, for an initial portion of a data stream, decoder 120 writes that data at the default data density, e.g., the data density providing the highest data integrity.

In FIG. 1, multi-level write circuit 130 receives the N-bit value from input data buffer 110 and writes the N-bit value in the next memory cell in the set storing the data stream. Alternatively, since the number N can change from one data value to the next, decoder 120 retrieves fixed-size data values from input data buffer 110 and provides variable-size data values to multi-level write circuit 130.

A playback operation in memory 100 reads the sequence of memory cells corresponding to a data stream and determines a sequence of data values that constitute the data stream. For identification of data values in the data stream, decoder 170 decodes data values as read from memory array 150 to determine the number of bits read from subsequent memory cells in the sequence. However, the default number of bits are read from each of one or more initial memory cells that store an initial portion of the data from a data stream. Accordingly, no decoding is required to determine the number of bits read from the initial memory cells that hold the initial portion of the data from a data stream. In most practical applications, the initial data is stored with one or two bits per memory cell (i.e., N=1 or 2). The high data integrity achieved with the small number of bits per cell is typically appropriate for the header information that may be found at the start of the data stream.

Decoder 170 controls the reading mode of multi-level read circuit 160 to select the number of bits read from each memory cell. Output data buffer 180 receives the sequence of data values from multi-level read circuit 160 directly as shown in FIG. 1 or alternatively via decoder 170. Similarly, decoder 170 can receive the sequence of data values from multi-level read circuit 160 directly as shown in FIG. 1 or via output data buffer 180. Decoder 170 uses the sequence of data values associated with the header or other format bits of the data stream to determine how many bits to read from subsequently read memory cells in Flash memory array 150. Output data buffer 180 converts the sequence of data values into a serial bit stream or any other output format.

In the exemplary embodiment illustrated in FIG. 1, decoder 120 includes a shift register 122, programmable array logic (PAL) 124, data type identification logic 126, and control logic 128. For a record operation, shift register 122 receives a serial data stream and provides a parallel multi-bit data signal to the input terminals of PAL 124.

PAL 124 is programmed according to the format of the data stream and includes a user accessible interface that permits re-programming of PAL 124 for use with different industry standards for data stream. Architectures for such PALs are well known in the art and can employ non-volatile storage cells having a construction similar to the construction of memory cells in multi-bit-per-cell Flash memory array 150.

PAL 124 cooperates with data type identification logic 126 to identify a data type for each portion of the data stream. The data type for a portion of the data stream determines the writing mode (i.e., the number of bits stored per cell) for that portion of the data stream. For example, a typical format for a data stream divides the stream into frames with each frame having a header, side information, and main data. When started on a recording operation, PAL 124 generates a sync signal when the content of shift register 122 corresponds to a synchronization value found in the header of a data frame. PAL 124 can be further programmed to extract or determine from the data stream a frame length for a current frame, i.e., the number of data bits in the frame.

PAL 124 being programmable and re-programmable allows memory 100 to adapt to different standards for data streams being recorded. Generally, memory 100 would be used to store one or more data streams of a specific format. However, data streams having different formats could be simultaneously stored in memory array 150, and the programming of PAL 124 can be re-programmed "on-the-fly" when required to store or playback a data stream conforming to a specific standard.

Based on the output signals from PAL 124, data type identification logic 126 determines writing modes for the following operations writing data from data buffer 110 to memory array 150. The number N of bits changes for different portions of the data frame. For example, the header information, which requires a highest level of data integrity, can be stored using a few bits (e.g., 1 or 2 bits) per cell. For sound or image data, a lower level of data integrity provides good performance, and memory 100 uses a larger number of bits per cell for storage of such data (e.g., 4 or more bits per cell).

Decoder 170 operates in a manner similar to that of decoder 120. In particular, both decoders 120 and 170 receive a data stream and identify a number of bits corresponding to a memory cell. Accordingly, an embodiment of the invention can reduce the amount of circuitry by eliminating some or all of the elements of decoder 170, and using circuitry from decoder 120 in the control of multi-level write circuit 120 and multi-level read circuit 160.

Figure 2:
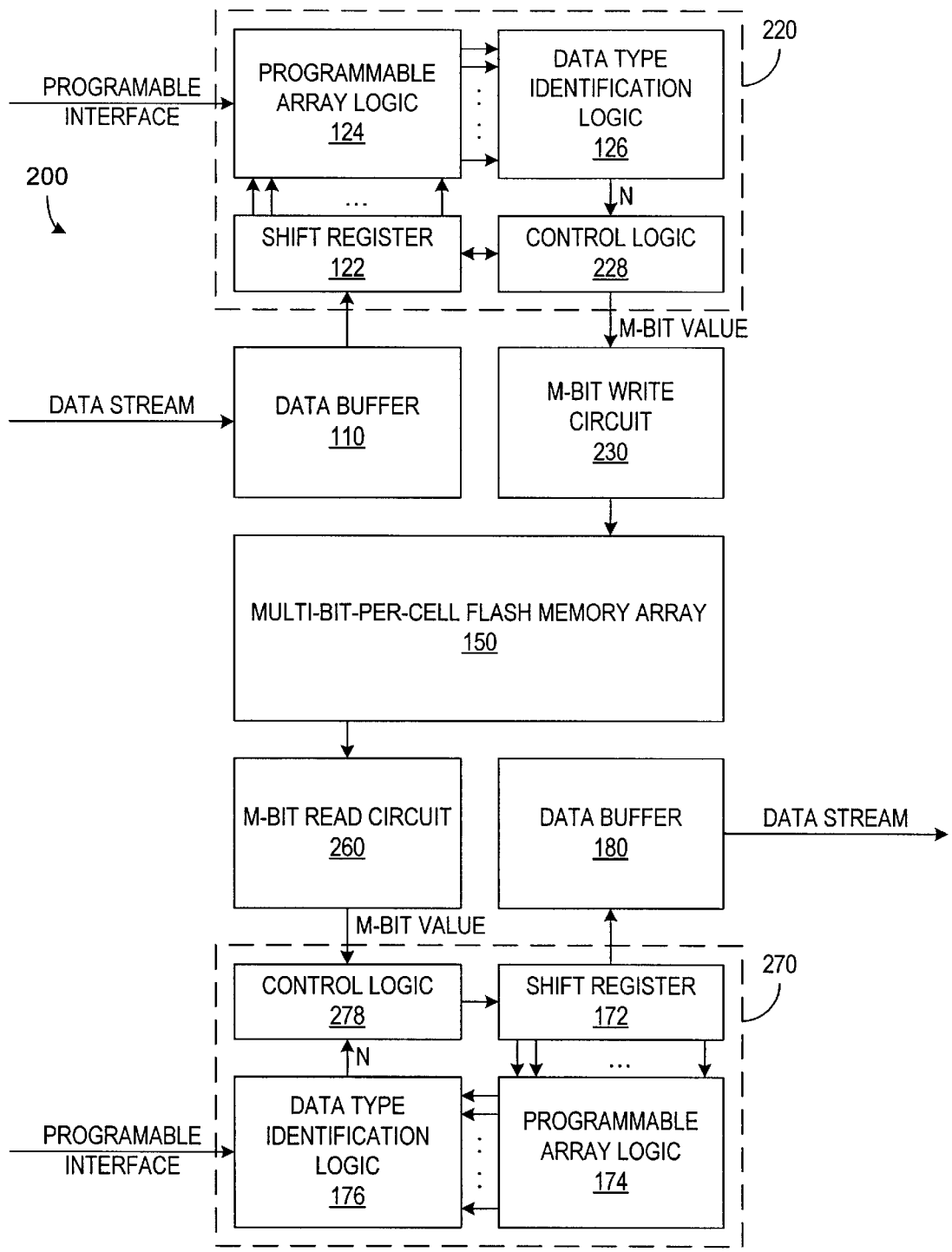
FIG. 2 is a block diagram of a multi-bit-per-cell memory in accordance with another embodiment of the invention.

FIG. 2 is a block diagram of a memory 200 in accordance with another embodiment of the invention. Memory 200 is substantially the same as memory 100 except that a decoder 220, an M-bit write circuit 230, an M-bit read circuit 260, and a decoder 270 in memory 200 differ from decoder 120, multi-level write circuit 130, multi-level read circuit 160, and decoder 170 in memory 100. More particularly, for a write operation, M-bit write circuit 230 always receives an M-bit value (where M is greater than or equal to the maximum number of data bits stored in any single memory cell) and programs a corresponding memory cell to a threshold voltage corresponding to the M-bit value.

Decoder 220 includes control logic 228 that generates the M-bit values for M-bit write circuit 230, from N-bit values where N depends on the data type and is less than or equal to M. More specifically, control logic 228 receives from identification logic 126 a signal indicating the number N of bits for the next memory cell. Control logic 228 then extracts N bits from shift register 122 (or alternatively from data buffer 110), converts the N-bit value into an M-bit value, and provides the M-bit value to M-bit write circuit 230.

The M-bit value resulting from conversion of an N-bit value is such that threshold voltage drift and inaccuracies that may erroneously change, set, or interpret the threshold voltage representing the M-bit value are likely to leave an M-bit value that still corresponds to the correct N-bit value when read. Thus, when N is less than M, memory 100 stores N-bit values with data integrity greater than the data integrity of M-bit values.

For a read operation, M-bit read circuit 260 sends to decoder 270 an M-bit value that corresponds to the current threshold voltage of a memory cell being read. Control logic 278 in decoder 270 converts that M-bit value to an N-bit value where N is less than or equal to M and depends on the data type indicator from logic 176. Control logic 278 passes the resulting N-bit value to shift register 172 and/or data buffer 180. The remainder of memory 200 operates in the same fashion as memory 100 of FIG. 1.

Figure 3:
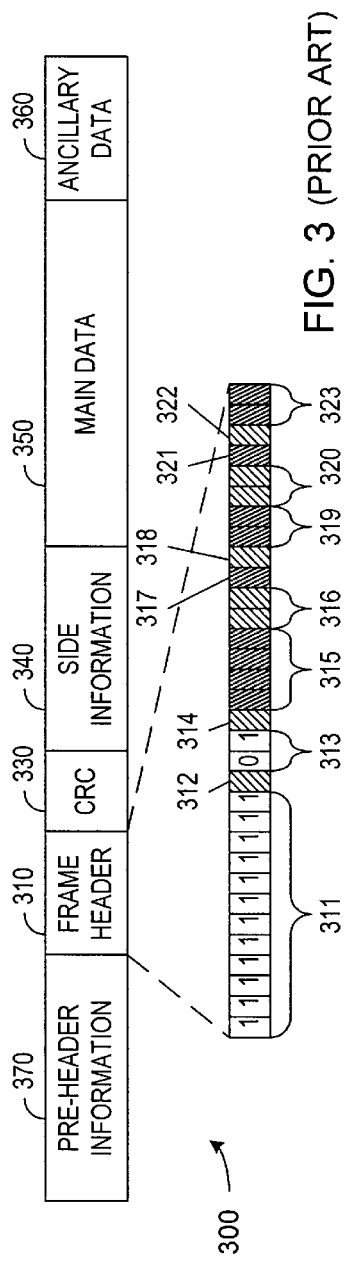
FIG. 3 illustrates the format of a data frame according to the MP3 standard.

FIG. 3 illustrates the format of a frame in an MP3 data stream, which memory 100 or 200 (specifically PALs 124 and 174) can be programmed to record and playback. Memory 100 with appropriate modifications or re-programming could alternatively store any other data format. In the MP3 format, a data frame 300 includes a 4-byte frame header 310, two CRC (cyclic redundancy code) bytes 330 assuming the protection bit is set, 17 or 32 bytes of side information 340, between 8 and 1417 bytes of main data 350, and a variable amount of ancillary data 360. The 4-byte header includes a 12-bit synchronization pattern 311, an ID bit 312, a 2-bit layer field 313, a CRC bit 314, a bit rate field 315, a sampling frequency field 316, a padding bit 317, a private bit 318, a mode field 319, a mode Ext field 320, a © bit 321, an O/C bit 322, and an Emphasis field 323. Pre-header information 370, which precedes frame header 310 in the data stream, can be valid main data for the frame.

Figure 4:
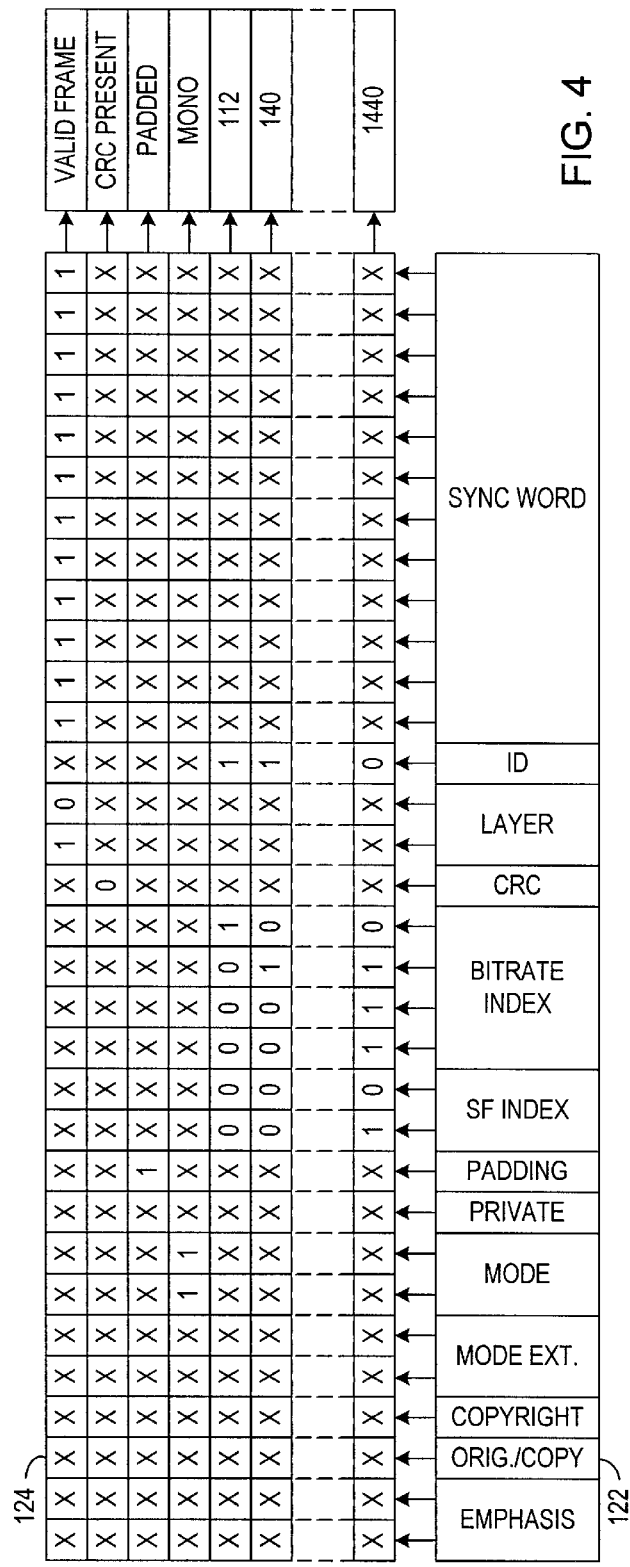
FIG. 4 illustrates the programming of a programmable logic array in a data stream decoder in accordance with an embodiment of the invention.

FIG. 4 illustrates the programming of input and output signals of programmable array logic 124 in accordance with an exemplary embodiment of the invention. Programmable array logic (PAL) designs are well known in the art and could be constructed using an array of flash memory cells adjacent to regular data storage array 150.

The input signals to PAL 124 are from shift register 122. In FIG. 4, the input signals are named in accordance with the fields in a frame header in accordance with the MP3 protocol. In particular, the signals from oldest in the shift register are SYNC WORD (12 bits), ID, LAYER (2 bits), CRC, BIT RATE (4 bits), SF INDEX (2 bits), PADDING, PRIVATE, MODE (2 bits), MODE EXT. (2 bits), COPYRIGHT, ORIG./COPY, and EMPHASIS (2-bits). The output signals are VALID FRAME, CRC PRESENT, PADDED, MONO, MDP 112, MDP 140, MDP 168, . . . , MDP 1296, and MDP 1440.

Each output signal is asserted only if input signals from the shift register 122 have the bit values equal to those in the row of array 124 that is associated with the output signal. In array 124 of FIG. 4, "X" indicates that the value of the input bit does not affect the output signal. For example, output signal VALID FRAME is only asserted if the (oldest) twelve bits corresponding to input signal SYNC WORD are all ones and the two bits corresponding to signal LAYER are "10b". These values are according to the MP3 protocol for the frame header. Data values in the other fields are irrelevant to generation of output signal VALID FRAME.

Signals CRC PRESENT and PADDED are asserted if the MP3 header indicates a CRC code or PADDING are in the data frame. Signal MONO is asserted if the data frame contains audio data in mono format. The asserted one of signals MDP 112, MDP 140, MDP 168, . . . , MDP 1296, and MDP 1440 indicates the main data pointer for the data frame.

Data type identification logic 126 uses the output signals from PAL 124 to determine the mode or the number of data bits to be grouped and written to each memory cell. In particular, once signal VALID FRAME is asserted, data type identification logic 126 can determine the size and data type of a series of portions of the data stream. For MP3, for example, the header can be written one bit per memory cell (N=1), while side information, main data, and ancillary data are respectively written at two (N=2), four (N=4), and four (N=4) bits per memory cell. Data type identification logic 126 counts the number of write operations and changes the write mode after the last value of a specific data type is written. For a last data value of a portion of the data stream, data type identification logic 126 can change the number of bits written so that no memory cell stores data from adjacent portions when the adjacent portions have different data integrity requirements.

Shift register 172, PAL 174, and logic 176 and 178 manipulate data multi-level read circuit 160 reads from the array 150. Otherwise, shift register 172, PAL 174, and logic 176 and 178 work for the read operation in a similar manner to that of shift register 122, PAL 124, and logic 126 and 128 for a write operation.

A record operation can ignore (i.e., not write) data from the data stream when the data appears to be invalid. In particular, data from the data stream can be temporarily kept in input buffer 110 until decoder 120 or 220 identifies a synchronization pattern, decodes a header, and identifies the start of the valid data. For an MP3 frame, synchronization pattern 311 is twelve consecutive bits with value one. As described above, PAL 124 activates signal VALID FRAME when twelve consecutive "1"s are in the appropriate positions in shift register 122. (The sequence of twelve "1"s is not permitted in other parts of an MP3 data frame.) In response to the signal VALID FRAME, logic 126 identifies the start of valid data in the data stream, determines the type of data, and selects for a writing mode (e.g., a number of bits N) for that data. The six bytes beginning with and including the synchronization pattern correspond to the data in frame header 310 and CRC bytes 330 for MP3. However, writing is delayed until decoder 120 decodes at least part of side information 340.

The side information for MP3 consists of 17 bytes for a single channel bit stream and 32 bytes otherwise. These bytes represent a main data begin (MDB) pointer, side information for both granules, side information for granule 0, and side information for granule 1. The main data is not necessarily next to the side information. The first nine bits of side information 340 provide the MDB pointer, which is a 9-bit pointer that indicates the location of the beginning byte of main data 350 belonging to the current frame. The location is specified as a negative offset from the first byte of the synchronization word. If the MDB pointer points before the start of the file, the data frame is invalid and does not need to be stored in flash memory array 150. However, data following a header of an invalid frame may be valid data for the next frame and is held in input buffer 110 pending identification of the next frame's header.

Decoder 120 can determine the frame length and other format information for a frame from the frame header 310 and side information 340. More specifically, the frame length depends on the values in bit rate field 315 and sampling frequency field 316 in frame header 310. Based on the frame length and the MDB pointer, data type identification logic 126 selects a writing mode or a number of bits per cell for each portion of the data frame 300. Multi-level write circuit 130 receives data values of the specified widths from the associated locations in data buffer 110 or shift register 122 and writes each data value in a memory cell in memory array 150.

Figure 5:
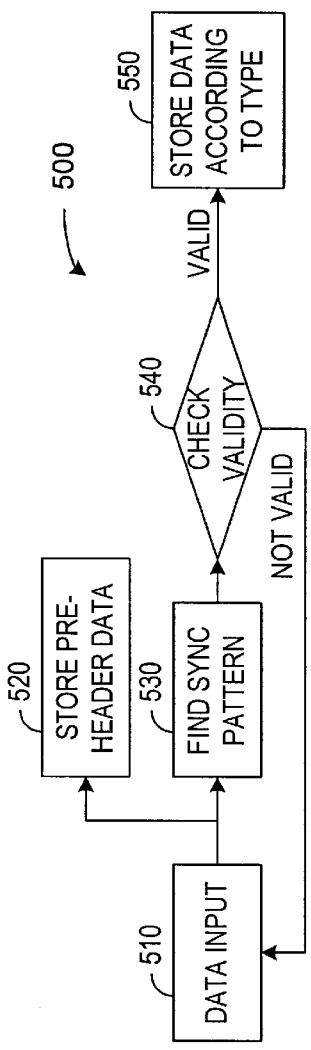
FIG. 5 is a flow diagram of a process for identifying data frames in a data stream and storing the data frames.

A record operation for an MP3 file may need to handle data that precedes a valid header in a data stream. FIG. 5 illustrates a record operation for an MP3 file. Data input in step 510 is stored (step 520) while the data is searched for a synchronization pattern (step 530). In the initial storing step 520, data can be kept in input data buffer 110 and shifted through shift register 122 until PAL 124 finds a valid frame header. When the sync pattern is found, decoder 120 in step 540 checks to determine whether the following data represent a valid frame header. If a valid data frame header is found, decoder 120 can identify types for the data, and a data storage operation 550 stores the identified data using writing modes for the different data types. If a sync pattern does not correspond to a valid frame header, data inputting, buffering, and searching for the sync pattern continue in steps 510 and 530. Invalid data coming before the first valid header can be discarded. Additionally any valid pre-header information having a data type that cannot be determined until a following header is decoded can be written using the default resolution (i.e., the default number of bits per memory cell) to simplify the record and playback operations.

Figure 6:
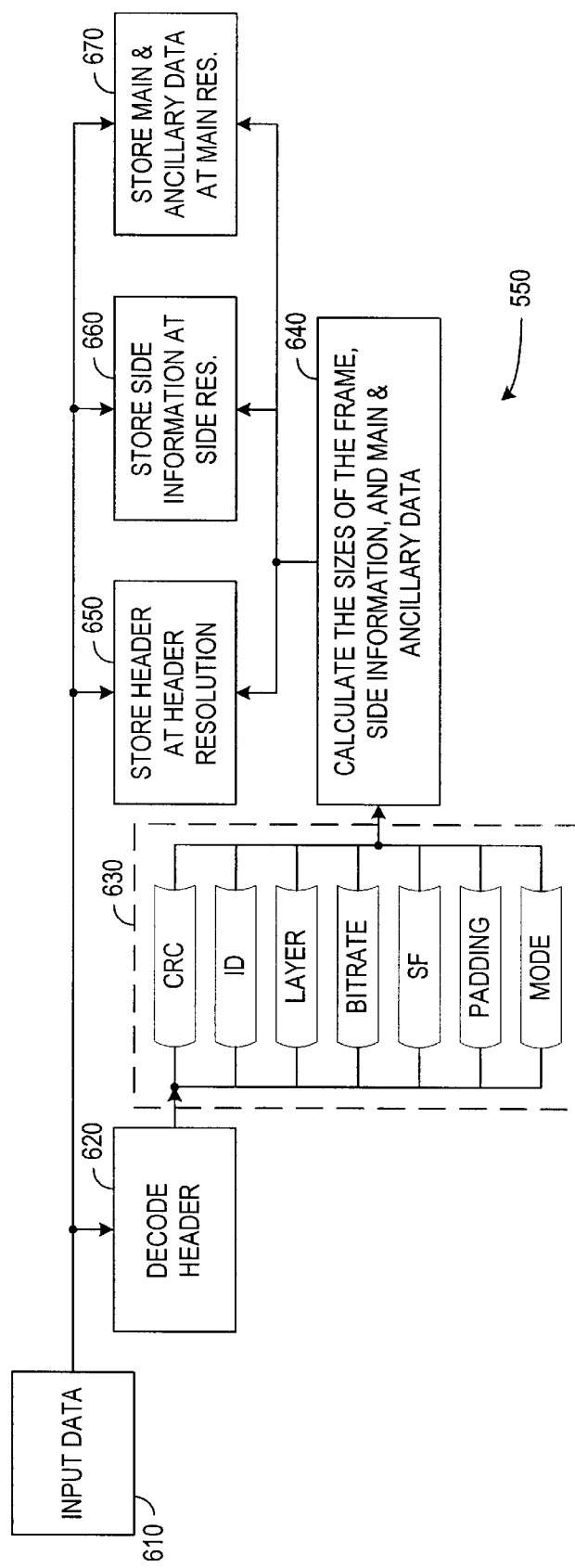
FIG. 6 is a flow diagram of a process for storing a data frame using storage densities selected according to data type.

FIG. 6 illustrates an embodiment of store operation 550 that takes place when a valid header is found in an MP3 data stream. A decode operation 620 and a write operation 650 operate on a portion of the input data 610 corresponding to the header of a data frame. Decoding operation 620 separates fields 630 of the header for use in a calculation 640 of the sizes of the side information, the main data, and the ancillary data in the data frame. The header of an MP3 data frame has a fixed length so that decode operation 620 and store operation 650 process a fixed number of bits.

Store operation 650 begins with the first portion of input data 610 from data buffer 110 and stores the data in sequential memory cells in memory array 150. Store operation 650 uses a header rate HR, e.g., one bit per cell, for header information, which typically requires a low storage density for high reliability. A count of data written during store operation 650 determines when writing of the header is complete. An address counter (not shown) that controls where data is written can indicate the count.

When writing of the header is finished, a storage operation 660 for side information starts. The storage of side information uses a side information resolution rate SR required for side information, which typically requires a moderate storage density (e.g., two or three bits per cell) for reasonable reliability. The side information can tolerate a reasonable error rate without serious degradation of sound quality resulting when the MP3 data stream is read out and played. Storage operation 660 ends when a count of bits written during storage operation 660 matches the size calculated (step 640) for the side information.

When writing of the side information is finished, a storage operation 670 for main data and ancillary data starts. In this embodiment of the invention, the main and ancillary data are stored at the same storage density. In particular, the main and ancillary data can tolerate a small amount of error, and therefore storage operation 670 use a main rate MR for efficient, high-density storage (e.g., four bits per cell). Storage operation 670 ends when a count of data bits written during storage operation 670 matches the combination of the sizes calculated for the main and ancillary data.

The synchronization pattern of the next data frame should immediately follow the last main or ancillary data written. Accordingly, the recording operation can return to operation 530 of FIG. 5 to search for the synchronization pattern after store operation 550 stores a data fame.

Figure 7:
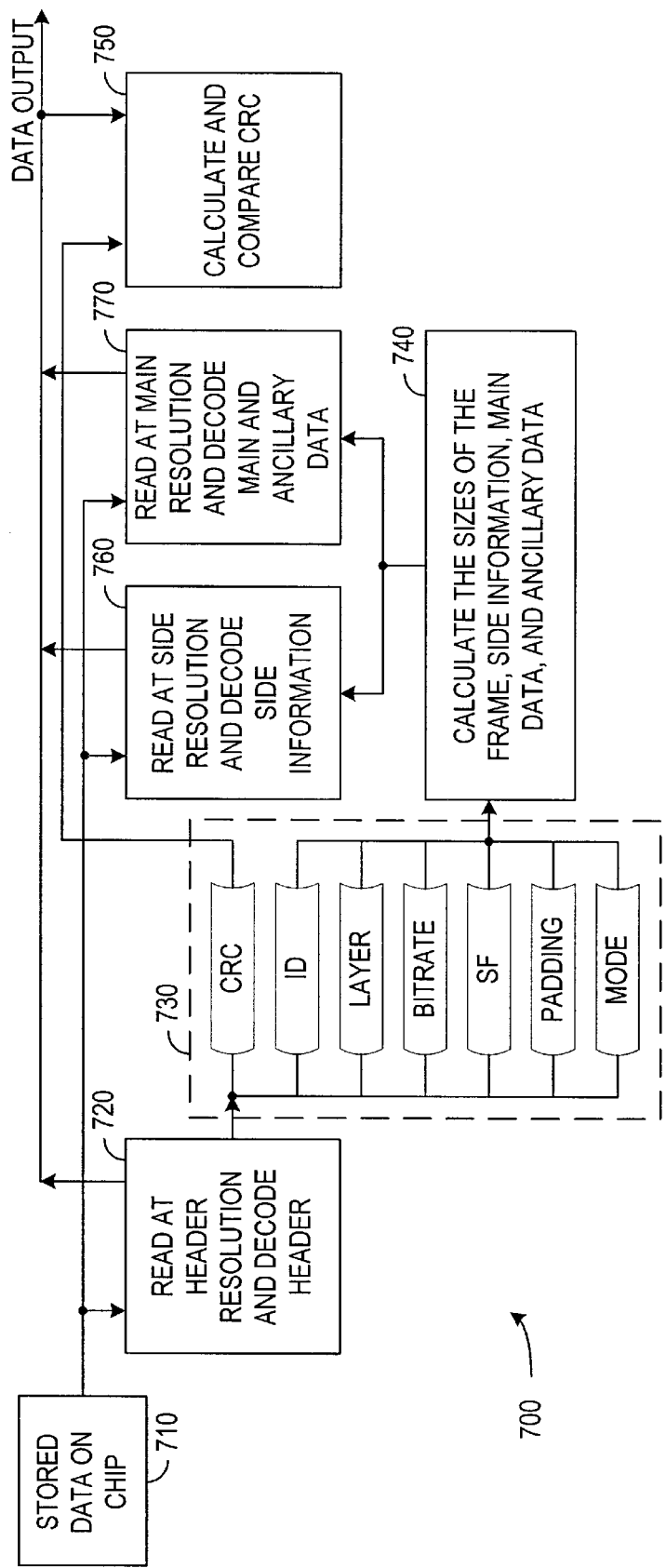
FIG. 7 is a flow diagram of a process for reading data stored at different densities to reconstruct a data stream having a particular format.

FIG. 7 illustrates a read operation 700 in accordance with an embodiment of the invention. Read operation 700 reads a data frame that starts at an address (e.g., with a memory cell) identified either from directory indicating the starts of recorded data streams or as the address following a data frame just read.

An initial read operation 720 uses the default resolution that is appropriate for a header and reads consecutive memory cells beginning at the start of the recorded data stream. While reading at the default resolution, read operation 720 can read the header or other information, which can be output to data output buffer 180. Simultaneously, decoding identifies the synchronization field of the header and separates the header into fields 730 for use in a calculation 740 of the sizes of the side information, the main data, and the ancillary data. Additionally, for error detection and correction, a CRC calculation 750 can be performed. Following the synchronization field, read operation 720 reads a fixed number of memory cells depending on the number of bits stored per cell for header information and the fixed size of the header.

A read operation 760 reads consecutive memory cells to extract side information and accordingly reads from each memory cell the number of bits used per cell for side information. The number of memory cells read depends on the calculation 740 of the size of the side information. Side information resulting from read operation 760 is output to data output buffer 180.

When a count of the memory cells or data bits read reaches the size of the side information, the memory switches to a read mode for main and ancillary data. Accordingly, following read operation 760, a read operation 770 reads the main and ancillary data using a number of bits per cell used in storage of the main and ancillary data and output the data to output data buffer 180. Reading the main and ancillary data continues until a data count equals the calculated size of the main and ancillary data.

After reading the last portion of one data frame, a playback operation either ends or starts again with the read operation 720 at the default resolution for the next data frame in a data stream.

Although the invention has been described with reference to particular embodiments, the description is only an example of the invention's application and should not be taken as a limitation. For example, although the described embodiments of the invention include the capability to both record and playback data streams, alternative embodiments may be capable of only recording or playing back data streams. Various other adaptations and combinations of features of the embodiments disclosed are within the scope of the invention as defined by the following claims.

We claim:

1. A multi-bit-per-cell-memory comprising:
   an array of non-volatile memory cells;
   a write circuit coupled to the array; and
   a decoder coupled to receive a data stream and control the write circuit to write data from the data stream into the array, wherein during a recording operation, the decoder decodes the data stream to identify data types for portions of the data stream, and for each of the portions of the data stream, the decoder selects a number of bits written per memory cell when writing data from that portion, the number of bits per memory cell for any portion of the data stream being selected according to the data type of the portion.

2. The multi-bit-per-cell memory of claim 1, further comprising a read circuit coupled to the array and the decoder, wherein during a playback operation, the decoder:
   receives a data stream that the read circuit reads from the array;
   decodes the data stream to identify data types for portions of the data stream; and
   for each of the portions of the data stream, selects a number of bits to read from each memory cell storing that portion, the number of bits per memory cell for any portion of the data stream being selected according to the data type of the portion.

3. The multi-bit-per-cell memory of claim 2, wherein the decoder comprises programmable array logic that is programmed according to a protocol expected for the data stream.

4. The multi-bit-per-cell memory of claim 3, wherein the protocol is selected from a group consisting of MPEG, JPEG, GIF, and AC-3.

5. The multi-bit-per-cell memory of claim 3, wherein the programmable array logic includes an interface that permits re-programming of the programmable array logic to adapt the multi-bit-per-cell memory to another protocol.

6. The multi-bit-per-cell memory of claim 1, further comprising:
   a read circuit coupled to the array and the decoder; and
   a second decoder coupled to control the read circuit and receive a second data stream that the read circuit reads from the array, wherein during a playback operation, the second decoder decodes the second data stream to identify data types for portions of the second data stream, and for each of the portions of the second data stream, the second decoder selects a number of bits to read from each memory cell storing that portion, the number of bits per memory cell for any portion of the second data stream being selected according to the data type of the portion.

7. The multi-bit-per-cell memory of claim 1, wherein the decoder comprises programmable array logic that is programmed according to a protocol expected for the data stream.

8. The multi-bit-per-cell memory of claim 7, wherein the protocol is selected from a group consisting of MPEG, JPEG, GIF, and AC-3.

9. The multi-bit-per-cell memory of claim 1, wherein the decoder performs decoding in accordance with a protocol selected from a group consisting of MPEG, JPEG, GIF, and AC-3.

10. The multi-bit-per-cell memory of claim 1, wherein the write circuit is operable in a plurality of modes, each mode corresponding to a different number of bits that the write circuit writes per non-volatile memory cell.

11. The multi-per-cell memory of claim 1, wherein the decoder comprises:
   a shift register connected to receive data from the data stream;
   data type identification logic coupled to the shift register, the data type identification logic generating a signal that selects a number N from a set of values less than a number M, the number N corresponding to a type for data in the shift register; and
   control logic coupled to the shift register and the data type identification logic, wherein in response to the signal indicating the number N, the control logic extracts N bits of data from the shift register and generates a M-bit signal corresponding to the N bits extracted, and wherein
      the write circuit writes the N bits to a memory cell by setting a threshold voltage of the memory cell to a level according to the M-bit signal from the control logic.

12. The multi-bit-per-cell memory of claim 11, wherein the data type identification logic is connected to the shift register via programmable array logic.

13. The multi-bit-per-cell memory of claim 12, wherein the programmable array logic is programmed according to a protocol expected for the data stream.

14. The multi-bit-per-cell memory of claim 13, wherein the protocol is selected from a group consisting of MPEG, JPEG, GIF, and AC-3.

15. The multi-bit-per-cell memory of claim 13, wherein the programmable array logic includes an interface that permits re-programming of the programmable array logic to adapt the multi-bit-per-cell memory to another protocol.

16. A multi-bit-per-cell-memory comprising:
   an array of non-volatile memory cells;
   a read circuit coupled to the array; and
   a decoder coupled to control the read circuit and receive a data stream that the read circuit reads from the array, wherein during a playback operation, the decoder decodes the data stream to identify data types for portions of the data stream, and for each of the portions of the data stream, the decoder selects a number of bits extracted from each memory cell storing that portion, the number of bits extracted per memory cell for any portion of the data stream being selected according to the data type of the portion.

17. The multi-bit-per-cell memory of claim 16, wherein the decoder comprises programmable array logic that is programmed according to a protocol expected for the data stream.

18. The multi-bit-per-cell memory of claim 17, wherein the programmable array logic includes an interface that permits re-programming of the programmable array logic to adapt the multi-bit-per-cell memory to another protocol.

19. The multi-bit-per-cell memory of claim 16, wherein the read circuit is operable in a plurality of modes, each mode corresponding to a different number of bits that the read circuit read per non-volatile memory cell.

20. The multi-per-cell memory of claim 16, wherein the read circuit has an M-bit output signal representing a value read from a memory cell, and the decoder comprises:
   a shift register;
   data type identification logic coupled to the shift register, the data type identification logic generating a signal that selects a number N from a set of values less than M, the number N corresponding to a type for data following data that is in the shift register; and
   control logic coupled to the shift register and the data type identification logic, wherein in response to the signal indicating the number N, the control logic converts the M-bit signal to N bits of data and feeds the N bits of data to the shift register.

21. The multi-bit-per-cell memory of claim 20, wherein the data type identification logic is connected to the shift register via programmable array logic.

22. The multi-bit-per-cell memory of claim 21, wherein the programmable array logic is programmed according to a protocol expected for the data stream.

23. The multi-bit-per-cell memory of claim 22, wherein the protocol is selected from a group consisting of MPEG, JPEG, GIF, and AC-3.

24. The multi-bit-per-cell memory of claim 22, wherein the programmable array logic includes an interface that permits re-programming of the programmable array logic to adapt the multi-bit-per-cell memory to another protocol.

25. A recording device for data streams having a protocol, the device comprising:
   an array of non-volatile memory cells;
   a write circuit coupled to the array; and
   a decoder coupled to receive a data stream and control the write circuit to write data from the data stream into the array, wherein during a recording operation, the decoder decodes the data stream according to the protocol to identify data types for portions of the data stream, and for each of the portions of the data stream, the decoder selects a number of bits written per memory cell when writing data from that portion, the number of bits per memory cell for any portion of the data stream being selected according to the data type of the portion.

26. The recording device of claim 25, wherein the decoder comprises programmable array logic that is programmed according to the protocol expected for the data stream.

27. The recording device of claim 26, wherein the programmable array logic includes an interface that permits re-programming of the programmable array logic to adapt the recording device to record a data stream having another protocol.

28. The recording device of claim 25, wherein the protocol is selected from a group consisting of MPEG, jpeg, gif, and AC-3.

29. A playback device for data streams having a protocol, the device comprising:
   an array of non-volatile memory cells;
   a read circuit coupled to the array; and
   a decoder coupled to receive a data stream from the read circuit and to control the read circuit when reading from the array, wherein during a playback operation, the decoder decodes the data stream at least a portion of data stream according to the protocol and identifies data types for subsequent portions of the data stream, and for each of the portions of the data stream, the decoder selects a number of bits read per memory cell when reading data from that portion, the number of bits per memory cell for any portion of the data stream being selected according to the data type of the portion.

30. The playback device of claim 29, wherein the decoder comprises programmable array logic that is programmed according to the protocol expected for the data stream.

31. The playback device of claim 30, wherein the programmable array logic includes an interface that permits re-programming of the programmable array logic to adapt the recording device to record a data stream having another protocol.

32. The recording device of claim 30, wherein the protocol is selected from a group consisting of MP3 and MPEG.

33. A method for recording a data stream in a memory, the method comprising:

decoding the data stream to distinguish a plurality of portions of the data stream and determine corresponding data types for the portions; and writing each portion of the data stream in a memory, wherein for each portion, writing data from that portion into a memory cell stores in the memory cell exactly N bits of the data, N being a number that depends on the data type corresponding to the portion.

34. The method of claim 33, further comprising inputting the data stream to a decoder integrated in the memory, wherein the decoder performs the decoding and controls the number of bits written per memory cell.

35. The method of claim 34, further comprising programming a programmable logic array in the decoder, wherein the programming enables the decoder to decode a data stream complying with a first standard.

36. The method of claim 35, further comprising re-programming the programmable logic array in the decoder, wherein the re-programming enables the decoder to decode a data stream complying with a second standard.

37. A method for playing back a data stream that was recorded in a memory, the method comprising:

reading a first portion of the data stream from the memory;

decoding the first portion to determine data types of one or more other portions of the data stream stored in the memory;

reading each of the other portions of the data stream from a memory, wherein for each portion, reading data from a memory cell storing data for the portion reads from the memory cell a number of bits that depends on the data type corresponding to the portion.

38. The method of claim 37, wherein reading the first portion of the data stream comprises reading a default number of bits from each memory cell of a plurality of memory cells containing data of the first portion.

39. The method of claim 37, further comprising programming a programmable logic array in the decoder, wherein the programming enables the decoder to decode a data stream complying with a first standard.

40. The method of claim 39, further comprising re-programming the programmable logic array in the decoder, wherein the re-programming enables the decoder to decode a data stream complying with a second standard.

* * * * *